United States Patent [19]

Mularie

[11] Patent Number: 4,559,121
[45] Date of Patent: Dec. 17, 1985

[54] METHOD AND APPARATUS FOR EVAPORATION ARC STABILIZATION FOR PERMEABLE TARGETS

[75] Inventor: William M. Mularie, Stillwater, Minn.

[73] Assignee: Vac-Tec Systems, Inc., Boulder, Colo.

[21] Appl. No.: 531,287

[22] Filed: Sep. 12, 1983

[51] Int. Cl.$^4$ ............................................. C23C 15/00
[52] U.S. Cl. ................................. 204/192 R; 204/298; 118/50.1; 118/723; 427/37; 427/47
[58] Field of Search .................... 204/164, 192 R, 298; 118/50.1, 723; 427/37, 47; 219/76.16, 121 PL, 121 PY; 313/160, 161; 315/338, 344

[56] References Cited

U.S. PATENT DOCUMENTS

| | | | |
|---|---|---|---|
| 2,972,695 | 2/1961 | Wroe | 313/157 |
| 3,625,848 | 12/1971 | Snaper | 204/192 R |
| 3,783,231 | 1/1974 | Sablev et al. | 219/123 |
| 3,793,179 | 2/1974 | Sablev et al. | 204/298 |
| 3,836,451 | 12/1974 | Snaper | 204/298 |
| 4,180,450 | 12/1979 | Morrison | 204/298 |
| 4,197,175 | 4/1980 | Moll et al. | 204/298 |
| 4,391,679 | 7/1983 | Morrison | 204/298 |
| 4,430,184 | 2/1984 | Mularie | 204/192 R |
| 4,448,659 | 5/1984 | Morrison, Jr. | 204/192 R |

FOREIGN PATENT DOCUMENTS 1113579  5/1968  United Kingdom ................ 204/298

OTHER PUBLICATIONS

Naoe et al., "Vacumn-Arc Evaporation of Ferrites and Compositions of Their Deposits", Japanese Journal of Applied Physics, vol. 10, No. 6, Jun. 1971.

Primary Examiner—Andrew H. Metz
Assistant Examiner—Terryence Chapman
Attorney, Agent, or Firm—Murray, Whisenhunt and Ferguson

[57] ABSTRACT

Apparatus and method for evaporation arc stabilization including a permeable target having a surface of material to be evaporated; circuitry for establishing an arc on the target surface for evaporating the target material, the arc being characterized by the presence of charged particles and a cathode spot which randomly migrates over the target surface; a confinement ring contacting and surrounding the target surface, the ring being composed of a material such as boron nitride and a permeable ring surrounding the target for effecting substantially uniform evaporation of the permeable target material from the target surface.

28 Claims, 7 Drawing Figures

METHOD AND APPARATUS FOR EVAPORATION ARC STABILIZATION FOR PERMEABLE TARGETS

RELATED PATENT APPLICATIONS

This application is related to application Ser. No. 492,831 now U.S. Pat. No. 4,430,184, filed May 9, 1983, by William M. Mularie entitled "Evaporation Arc Stabilization". It is also related to an application entitled "Improved Apparatus and Method for Evaporation Arc Stabilization for NonPermeable Targets Utilizing Permeable Stop Ring" filed by Anthony R. T. Lefkow on even date herewith. Furthermore, it is also related to an application entitled "Improved Method and Apparatus for Evaporation Arc Stabilization Including Initial Target Cleaning" filed by Charles F. Morrision, Jr. on even date herewith. All of the above applications are assigned to the assignee of the present application.

BACKGROUND OF THE INVENTION

This invention relates to arc stabilization processes and devices which may be employed, for example, in arc coating systems. Such coating systems are disclosed in U.S. Pat. Nos. 3,625,848 and 3,836,451 to Alvin A. Snaper and U.S. Pat. Nos. 3,783,231 and 3,793,197 to L. Sablev, et al. These systems are characterized by high deposition rates and other advantageous features. However, these advantages can be somewhat offset due to instability of the arc. That is, the arc involves currents of about 60 amperes, or more, concentrated into a cathode spot so small that current densities are $10^3$ to $10^6$ amperes per square inch. The voltages are 15 to 45 volts. Thus, power densities at the tiny cathode spot are in the order of megawatts/inch$^2$. Accordingly, local violence is an understatement. The target surface under the cathode spot flash evaporates from the intense heat. It is the evaporated target material which deposits as the coating on a substrate. The cathode spot migrates about the target surface in a random, jerky motion with reported velocities of many meters per second. Because of this random movement, damage to the device and contamination of the coating can occur if the spot moves off the target surface.

Different solutions to the arc instability problem have been proposed. Thus, in Sablev, et al., U.S. Pat. No. 3,793,179, a shield is placed close to the edge of the target. In particular, it is placed at a distance from the target which represents less than a mean free path of the gas present. In an arc discharge, gas and plasma are generated at the cathode spot with sufficient violence that local mean-free paths may occasionally be reduced to a few thousandths of an inch. When such a blast of local high pressure is blown under the shield, which is spaced at several millimeters (~80 thousandths of an inch), there is a finite possibility the arc can migrate under the shield. When this happens, there will be arc damage to the cathode, contamination of the evaporant, or the arc will extinguish.

Sablev, et al. U.S. Pat. No. 3,783,231, (copy submitted herewith) apparently addresses the foregoing problem by providing a feedback mechanism of some complexity that emphasizes the frustrations caused by the problem. The feedback involves the utilization of a magnetic field to retain the cathode spot on the target surface. U.S. Pat. No. 2,972,695 (copy submitted herewith) to H. Wroe, also suggests the utilization of a magnetic field for cathode spot retention.

SUMMARY OF THE INVENTION

It is an object of the present invention to provide in an arc evaporation process, stabilization of the arc for permeable targets in such a manner as to avoid the inadequacies and complexities of the prior art approaches.

It is a further object of this invention to provide arc stabilization of the above type for use in arc coating processes.

Other objects and advantages of this invention will be apparent from a reading of the following specification and claims taken with drawing.

DETAILED DESCRIPTION OF PREFERRED EMBODIMENTS OF THE INVENTION

Figure 1:
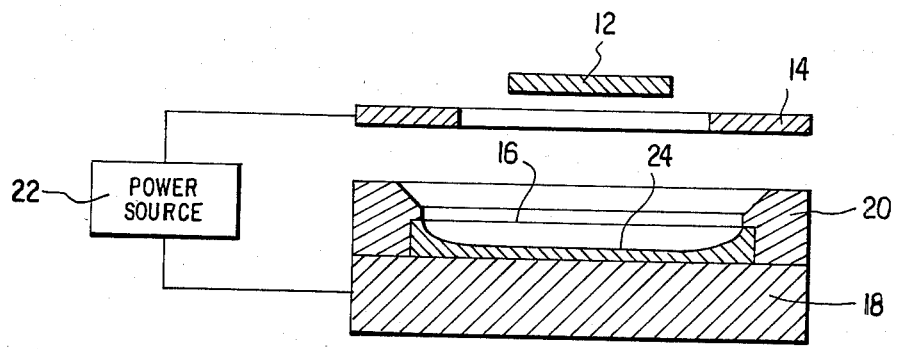
FIG. 1 is a schematic diagram in cross-section which illustrates the uniform erosion pattern which results when a non-permeable target is confined by a N-ring in accordance with above-mentioned, co-pending application Ser. No. 492,831 now U.S. Pat. 4,430,184.

Reference should be made to the drawing where like reference numerals refer to like parts.

Prior to discussing in detail an illustrative embodiment of the present invention, the invention of before-mentioned co-pending application Ser. No. 492,831, now U.S. Pat. No. 4,430,184, will be discussed in detail with respect to FIG. 1 since the latter invention is employed in the present invention.

In FIG. 1, an arc coating system for a substrate 12 comprises an anode 14 where, if desired, the anode and substrate may be the same member, a non-permeable target 16 of conductive or insulative material, a cathode 18 where, if desired, the target and cathode may be the same member, an arc confinement and retaining ring 20, and a power source 22, which is DC if the target is conductive and RF if it is insulative. If desired, separate rings may be used for the arc containment function and the target retention function. In accordance with the invention, the confinement ring is composed of boron nitride or a similar material as discussed in more detail hereinafter.

In operation, source 22 is energized across the anode and cathode to strike an arc between the anode and target in a well known manner. Arc initiating means (not shown) may be employed to initiate the arc. Target material is then flash evaporated from the cathode spot formed at the root of the arc on the target surface and deposited on the substrate as a coating. Confinement ring 20 contacts target 16 and surrounds an exposed area constituting an evaporation surface of the target to thereby confine the cathode spot to the evaporation surface in such a manner that continuous, stable operation is effected for the entire lifetime of the target even though the ring may be overlayed with evaporated target material many mils thick.

Briefly, the confinement ring is made of a material such that the ring is characterized by (a) a low absolute value of secondary emission ratio where preferably the ratio of the target is greater than that of the ring and (b) a low surface energy of the ring relative to that of the evaporant.

The secondary emission ratio $\delta$ is defined as the number of secondary electrons produced by a primary electron, or other charged particle, incident upon a target. Thus, $$\delta = \frac{\text{number of electrons emitted by material}}{\text{per primary charged particle}}$$

The number of electrons emitted by the target is dependent not only on the particular target material but also on the energy of the primary charged particle. In accordance with one aspect of the invention of the co-pending application, the secondary emission ratio of the confinement ring, $\delta$ (confinement ring), should be less than one at the mean energies of the charged primary particles typically found in arc coating processes such as disclosed in the aforementioned Snaper and Sablev patents where thse mean particle energies may extend from about 20–100 eV and typically are about 40–60 eV. Moreover, the secondary emission ratio of the target, $\delta$ (target) is preferably greater than $\delta$ (confinement ring).

One class of materials which, generally speaking, has a $\delta<1$ is the nitrides and boron nitride, in particular. Boron nitride has been observed to be effective with metal targets. It also can be used with insulative targets, many of which have a high secondary electron emission ratio due to a substantial oxide content. Titanium nitride, even though quite conductive electrically, also restricts arc paths.

In general, a further aspect of the invention of the copending application for effecting arc confinement is the low surface energy ($\gamma$) of the confinement ring relative to that of the evaporant—that is, $\gamma$(ring)<$\gamma$-(evaporant). In this regard, BN (surface energy of 600–700 ergs/cm.$^2$) is not wet by most metals at the termperatures encountered in the arc coating processes described in the aforementioned Snaper and Sablev patents. Only the oxides of lead, bismuth, copper and antimony will wet and attack BN, the surface energies of these oxides ranging from 100–300 ergs/cm.$^2$. However, BN and materials similar thereto are suitable for the practical applications encountered in arc coating processes.

In summary, confinement ring 20 should be formed from or coated with materials having the foregoing characteristics. The nitride compounds are particularly suitable and, in particular, the nitrides of boron and titanium. In this regard, it should be noted if the nitride compound constitutes less than 100% of the confinement ring composition, the ring will nevertheless function in the desired manner as long as the entire composition has the above-discussed characteristics. Hereinafter, a ring of the type described in the co-pending application will be termed an "N-ring".

Figure 2:
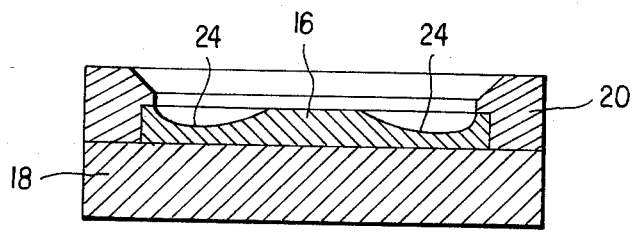
FIG. 2 is a schematic diagram in cross-section illustrating the erosion pattern which results when a permeable target is confined by an N-ring.

As can be seen in FIG. 1, as long as the target 16 is non-permeable, the erosion pattern 24 obtained with the confinement ring of the co-pending application is quite uniform. However, if a permeable target 16 is employed, the erosion pattern 24 is not uniform, as can be seen in FIG. 2. Examination of the target of FIG. 2 leads to the conclusion that the arc is influenced to move toward the edge of the permeable target, for there is no reason to expect it to move specifically toward the N-ring 20 otherwise.

The assignee of the present application has conducted experiments, one of which involved placing an N-ring on a large sheet of permeable material such that the plane of the ring was parallel to that of the sheet, the ring being in the approximate center of the sheet. An arc was struck within the ring and the resulting erosion pattern was normal—that is, is corresponded to that of FIG. 1.

Figure 3:
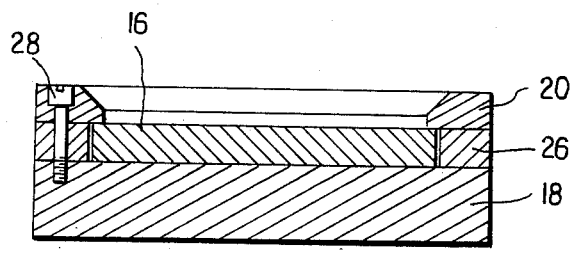
FIG. 3 is a schematic diagram in cross-section of an illustrative embodiment of an arc stabilization apparatus for a permeable target in accordance with the present invention.

The above principles are incorporated in the FIG. 3 embodiment of the present invention where a permeable target 16 is surrounded by a flat ring 26 made of a permeable material such as soft iron or Permalloy or the target material itself. In fact, any material considered to be permeable may be used, such materials including but not limited to iron; nickel; cobalt; and alloys thereof with small amounts of optional additives; ferrites; steel; etc. Further, the ring 26 may comprise an integral extension of the target itself. Hereinafter ring 26, whether it be a separate member, as shown in FIG. 3 or an integral extension of the target will be termed a "P-ring".

N-ring 20 is disposed around the periphery of target 16 and contributes to the confinement of the arc on the target surface. The N-ring also retains ring 26 and target 16 in place via a bolt 28 which is threaded into cathode body 18.

Although there is no intent to be limited to a particular theory of operation, the following considerations apparently are applicable to P-rings of the present invention. It has been observed a vacuum arc struck on a non-permeable target wanders randomly about, most often leaving the target for other areas of the cathode within a second or so. A permeable target looses the arc to other cathode areas in milliseconds. Obviously, for uncontaminated coatings, the arc must remain only on the target.

The early literature of magnetic fields applied to the vacuum arc indicates the arc moves most readily in the direction of greatest magnetic field density. Assuming this is the mechanism for forcing the arc to the edge of the target in FIG. 2, it appears the arc moves away from the permeable material that reduces field density.

Another insight relating to the containment mechanism is obtained from the work of Naoe and Yamanaka ("Vacuum-Arc Evaporations of Ferrites and Compositions of their Deposits" Japanese Journal of Applied Physics, Vol. 10, No. 6, June 1971, copy submitted herewith), who arc-evaporated ferrite composites from a cup-shaped ferrite target. They were attaining a melted portion of the target, and the oxide materials behaved very differently from the metals. They reported a very stable arc that moved in a very slow circular motion at the approximate center of the cup. They made no reference to this as unusual behavior, but gave considerable detail of the arc motion as observed visually. Implications relative to general arc containment were lacking.

To better understand this phenomenon the assignee of the present invention has used a DC currert through a wire to generate a cylindrical magnetic field of the type that the arc appears to produce close to the target. This wire has been brought into the proximity of various geometries of permeable targets and "iron filings diagrams" produced to give insights to the magnetic influence of these permeable materials on the magnetic field.

It should be noted this is somewhat different from the application of a magnetic field to interact with the arc field as applied in aforementioned U.S. Pat. Nos. 2,972,695 and 3,783,231, for no external field is applied. When current is passed through the wire, magnetic flux is generated symmetrically around the wire. When two wires are placed in parallel with current in the same direction through them, the wires are pulled toward each other. The field generated between the wires is cancelled, for the flux direction is different on the right versus the left of the wire.

In actuality, an arc is quite unique, and modeling it as a wire with current flowing is not a true indicator of what an arc will do. If sufficient current is permitted to flow in the arc, it will divide itself into two simultaneous arc spots moving independently about the cathode surface. This is quite the reverse of the wires which move together as current flows. Simple explanation of this difference between the arc and the wire is sometimes given in terms of the electrons being free to move sideways in space in the arc, but being confined within the wire. They try to move sideways in the wire, creating equal and opposite forces on the wires. Thus the wire moves opposite to the direction the arc moves where the magnitude of the force moving an arc toward the edge of a permeable target is significant relative to the random motion forces that typically move the arc about a non-permeable target.

Figure 4A:
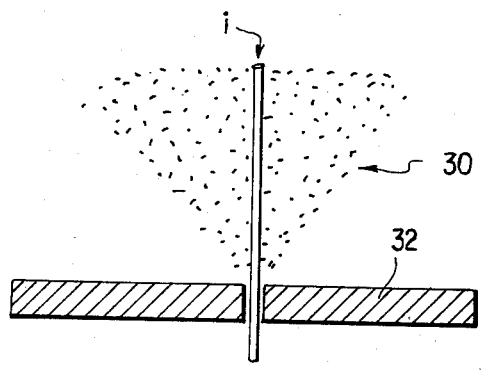
FIGS. 4(a), 4(b), 5(a), and 5(b) are schematic "iron filings" diagrams in cross-section which illustrate various conditions of permeable and non-permeable targets.
Figure 4B:
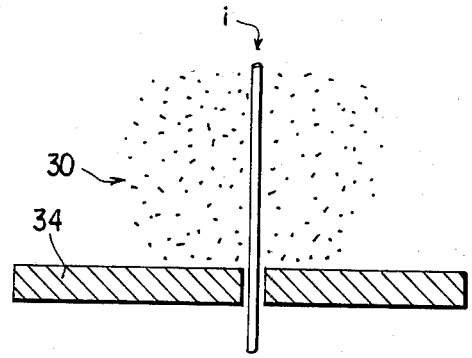
Figure 5A:
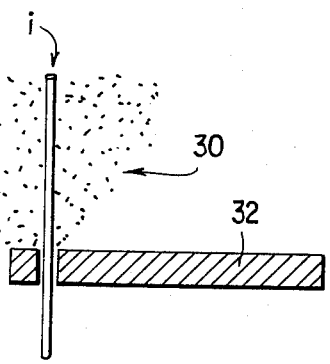
Figure 5B:
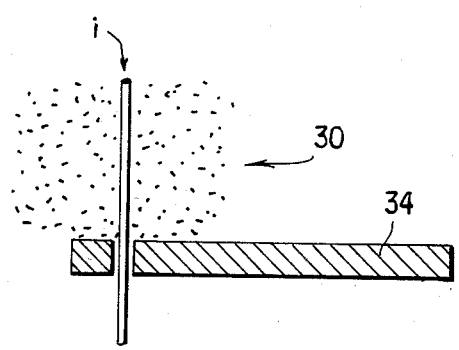

FIGS. 4(a), 4(b), 5(a), and 5(b) show the nature of the filing diagrams from the various conditions of permeable and non-permeable targets. In FIG. 4 less and less flux density 30 is seen as the iron plate 32 is approached for these lines (of which only the cross sections are seen) are drawn into the iron, for they travel more easily there. In the case of the aluminum target 34, the flux remains very constant as the plate is approached, as can be seen in FIG. 4(b). Moving to the target edge, as in FIG. 5(b), makes no change in the case of the aluminum target. However, as shown in FIG. 5(a) movement to the edge of the iron target produces a reasonably strong flux outboard of the target, and virtually none inboard. With the force on the arc thus outward, it is quite understandable that the arc races for the outside edge. The forces will be nil when the arc is perfectly in the target center, but normal random migration from the arc action will quickly push it off center. As it gets closer to an edge, the force toward the edge multiplies. It is thus quite logical that erosion would occur as shown in FIG. 2, for the arc is trapped between the induced electromagnetic force outward, and the "N"-ring which prevents the arc from moving further outward. There is relative freedom of motion only into the plane of FIG. 2. Thus the arc moves around the target perpendicularly to the trap. The attempt here is not to fully define the arc motion, but only to show certain aspects of it can be influenced significantly for purposes of control.

Furthermore, it follows that with the presence of P-ring 26 of FIG. 3, the lines of force travel as easily through ring 26 as they do through target 16 disposed within the inner periphery of the ring. Hence, the flux density within the ring is substantially equal to that outside the ring's inner perphery. Thus, there is no outward force on the arc as is the case in FIG. 2 device. Accordingly, the arc randomly migrates over the entirety of the permeable target surface in the same manner it migrates over the nonpermeable target of FIG. 1 to thereby effect uniform erosion of the permeable target.

It is to be understood that the above detailed description of the embodiment of the invention is provided by way of example only. Various details of design and construction may be modified without departing from the true spirit and scope of the invention as set forth in the appended claims.

I claim:

1. Apparatus for evaporation arc stabilization comprising
    a target having a surface of permeable material to be evaporated;
    means for evaporating the target material by establishing an arc on the target surface, the arc being characterized by the presence of charged particles and a cathode spot which randomly migrates over said target surface;
    a confinement ring contacting the target and surrounding the target surface, the ring being composed of a material having (a) a secondary emission ratio less than one at the mean energies of the charged particles of the arc and (b) a surface energy less than that of the evaproated target material to thereby confine the cathod spot to the target surface; and
    a permeable ring surrounding the target for effecting substantially uniform evaporation of the target material from the target surface.

2. Apparatus as in claim 1 where said permeable ring and said target constitute separate members.

3. Apparatus as in claim 1 where permeable ring and said target are integrally connected to another.

4. Apparatus as in claim 2 or 3 where said permeable ring is made of the same material as said target.

5. Apparatus as in claims 2 or 3 where said permeable ring is made of iron or Permalloy.

6. Apparatus as in claim 1 where the secondary emission ratio of the confinement ring is less than that of the target.

7. Apparatus as in claims 1 or 6 where the confinement ring comprises a nitride compound.

8. Apparatus as in claim 7 where the nitride compound is selected from the group consisting of boron nitride and titanium nitride.

9. Apparatus as in claim 8 where the nitride compound is boron nitride.

10. Apparatus as in claim 1 where the mean charged particle energies of said arc are about 20-100 eV.

11. Apparatus as in claim 7 where the mean charged particle energies of said arc are 40-60 eV.

12. Apparatus as in claim 1 including a substrate upon which the evaporated target material is deposited as a coating.

13. Apparatus as in claim 12 where the anode and substrate are the same member.

14. Apparatus as in claim 1 where the means for establishing the arc on the target surface includes a cathode and an anode.

15. Apparatus as in claim 14 where said target is mounted on said cathode.

16. Apparatus as in claim 14 where said target and cathode are the same member.

17. A method of evaporation arc stabilization comprising the steps of
    establishing an arc on a surface of a permeable target to evaporate the target, the arc being characterized by the presence of charged particles and a cathode spot which randomly migrates over said target surface;

confining the arc to the target surface with a confinement ring which contacts and surrounds the target surface, the ring being composed of a material having (a) a secondary emission ratio less than one at the mean energies of the charged particles of the arc and (b) a surface energy less than that of the evaporated target material; and surrounding the target with a permeable ring to thereby effect substantially uniform evaporation of the target material from the target surface.

18. A method as in claim 17 where said permeable ring and said target constitute separate members.

19. A method as in claim 17 where said permeable ring and said target are integrally connected to another.

20. A method as in claims 18 or 19 where said permeable ring is made of the same material as said target.

21. A method as in claims 18 or 19 where said permeable ring is made of iron or Permalloy.

22. A method as in claim 17 where the secondary emission ratio of the confinement ring is less than that of the target.

23. A method as in claim 17 where the mean charged particle energies of said arc are about 20–100 eV.

24. A method as in claim 17 where the mean charged particle energies of said arc are about 40–60 eV.

25. A method as in claim 17 where the confinement ring comprises a nitride compound.

26. A method as in claim 25 where the nitride compound is selected from the group consisting of boron nitride and titanium nitride.

27. A method as in claim 26 where the nitride compound is boron nitride.

28. A method as in claim 17 including depositing the evaporated target material on a substrate as a coating.

* * * * *